United States Patent
Hiroshige et al.

(10) Patent No.: US 8,287,768 B2
(45) Date of Patent: Oct. 16, 2012

(54) POLYTHIENYLENEVINYLENE THERMOELECTRIC CONVERSION MATERIAL

(75) Inventors: Yuji Hiroshige, Tokyo (JP); Naoki Toshima, Yamaguchi (JP)

(73) Assignee: 3M Innovative Properties Company, Saint Paul, MN (US)

( * ) Notice: Subject to any disclaimer, the term of this patent is extended or adjusted under 35 U.S.C. 154(b) by 433 days.

(21) Appl. No.: 12/677,835

(22) PCT Filed: Sep. 10, 2008

(86) PCT No.: PCT/US2008/075745

§ 371 (c)(1), (2), (4) Date: Mar. 12, 2010

(87) PCT Pub. No.: WO2009/035990

PCT Pub. Date: Mar. 19, 2009

(65) Prior Publication Data

US 2010/0252780 A1 Oct. 7, 2010

(30) Foreign Application Priority Data

Sep. 14, 2007 (JP) .................. 2007-239357

(51) Int. Cl.
*H01B 1/00* (2006.01)
*H01L 35/12* (2006.01)
*C08F 28/06* (2006.01)
*C08G 75/00* (2006.01)

(52) U.S. Cl. ............ 252/500; 136/236.1; 526/256; 528/377

(58) Field of Classification Search .......... 252/500; 136/236.1; 526/256; 528/377
See application file for complete search history.

(56) References Cited

U.S. PATENT DOCUMENTS

| 3,401,152 | A | * | 9/1968 | Wessling et al. ............ 528/391 |
| 3,706,677 | A | * | 12/1972 | Wessling et al. ............ 428/220 |
| 5,510,456 | A | | 4/1996 | Ichikawa et al. |
| 6,441,395 | B1 | | 8/2002 | Yu et al. |
| 6,759,587 | B2 | * | 7/2004 | Toshima et al. ............ 136/236.1 |
| 6,864,111 | B2 | | 3/2005 | Yu et al. |
| 7,601,909 | B2 | * | 10/2009 | Kanno et al. ................. 136/205 |
| 2006/0225782 | A1 | * | 10/2006 | Berke et al. .................... 136/252 |
| 2007/0254456 | A1 | | 11/2007 | Maruyama et al. |
| 2009/0134365 | A1 | * | 5/2009 | Sasaki et al. ............... 252/519.1 |

FOREIGN PATENT DOCUMENTS

| JP | 2000-323758 | 11/2000 |
| JP | 2001-326393 | 11/2001 |
| JP | 2002-502128 | 1/2002 |
| JP | 2002-100815 | 4/2002 |
| JP | 2003-332638 | 11/2003 |
| JP | 2003-332639 | 11/2003 |
| KR | 2007-0106460 | 11/2007 |

OTHER PUBLICATIONS

Jen, K.Y. et al., "Highly-conducting, Poly(2,5-Thienylene Vinylene) prepared via a Soluble Precursor Polymer," J. Chem. Soc., Chem. Commun., 309 (1987).*
Shim, H.K. et al., Electrical properties of Poly(1,4-phenylene vinylene-co-2,5-dimethoxy-1,4-phenylene vinylene)s and Poly(1,4-phenylene vinylene-co-2,5-thienylene vinylene)s, Bull. Korean Chem. Soc., vol. 11, No. 1, 11 (1990).*
Gregorius, "Preparation and Characterization of Poly(arylenevinylene) Copolymers and Their Blends," Macromolecules, 25, 6664-6669, (1992).
Yamada, et al., "New Conducting Polymer Film: Poly(2,5-thienylenevinylene) prepared via a Soluble Precursor Polymer," Journal of Chemical Society, Chemical Communication, pp. 1448-1449, (1987).
International Search Report, PCT/US2008/075745, International Filing Date Sep. 10, 2008.

* cited by examiner

*Primary Examiner* — Mark Kopec
*Assistant Examiner* — Jaison Thomas
(74) *Attorney, Agent, or Firm* — Jean A. Lown

(57) ABSTRACT

A thermoelectric conversion device including a thermoelectric conversion material including a polythienylenevinylene including units represented by formula (1), wherein R1 and R2 are each independently a hydrogen atom, or an alkoxy or alkyl group, and the thermoelectric conversion material is doped with a dopant.

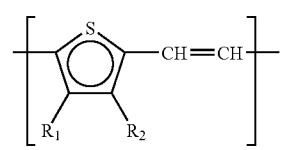

(1)

9 Claims, No Drawings

POLYTHIENYLENEVINYLENE THERMOELECTRIC CONVERSION MATERIAL

CROSS REFERENCE TO RELATED APPLICATIONS

This application is a national stage filing under 35 U.S.C. §371 of PCT/US2008/075745, filed Sep. 10, 2008, which claims priority to Japanese Application No. 2007-239357, filed Sep. 14, 2007, the disclosure of which is incorporated by reference in its/their entirety herein.

FIELD

This disclosure relates to an organic thermoelectric conversion device, a thermoelectric conversion device including a polythienylenevinylene thermoelectric conversion material and a method for producing the thermoelectric conversion material.

BACKGROUND

Thermoelectric elements such as thermoelectric generators or Pertier elements advantageously have high thermoelectric conversion efficiencies, are durable; and are efficiently produced at low cost. Materials such as BiTe, SiGe, PbTe and cobalt oxide have all been proposed and intensely investigated as thermoelectric conversion materials prepared from inorganic materials. Several such inorganic materials have been found to have practical properties. However, of these materials, some materials have to be produced through complicated processes, and some are toxic or create toxic byproducts.

Organic thermoelectric materials such as electroconductive polymers are usually easily processed and are generally safe. However, it is generally thought that their thermoelectric conversion properties are not comparable to inorganic materials. Polyanilines have been described as electroconductive polymers that could be used as thermoelectric materials (Japanese Unexamined Patent Publication (Kokai) No. 2000-323758 and Japanese Unexamined Patent Publication (Kokai) No. 2001-326393). Japanese Unexamined Patent Publication (Kokai) No. 2002-100815 describes a polyaniline in which the molecular structure is extended when dissolved in an organic solvent. A substrate spin coated with the solution produced a thin film of a thermoelectric conversion material. However, given the production process, production of practical amounts would be complicated. Japanese Unexamined Patent Publication (Kokai) No. 2003-332638 discloses a poly (3-alkylthiophene) as a thermoelectric conversion material. The reference describes that when the thermoelectric conversion material is doped with iodine, the Seebeck coefficient and electrical conductivity are increased, and as a result the thermoelectric conversion properties are improved. A polyphenylenevinylene and an alkoxy-substituted polyphenylenevinylene are disclosed as thermoelectric conversion materials in Japanese Unexamined Patent Publication (Kokai) No. 2003-332639. The polyphenylenevinylene doped with sulfuric acid and the alkoxy-substituted polyphenylenevinylene doped with iodine showed relatively good thermoelectric conversion properties. However, the sulfuric acid-doped polyphenylene-vinylene was difficult to process and lacked stability in an air atmosphere.

Therefore, there remains a need for organic thermoelectric conversion materials that have advantageous properties and can be easily produced.

SUMMARY

An organic thermoelectric conversion device, a thermoelectric conversion device including a polythienylenevinylene thermoelectric conversion material, and a method for producing the thermoelectric conversion material are provided.

A thermoelectric conversion device is provided that includes a thermoelectric conversion material that is doped with a dopant. The thermoelectric conversion material includes a polythienylenevinylene having thienylenevinylene units represented by formula (1)

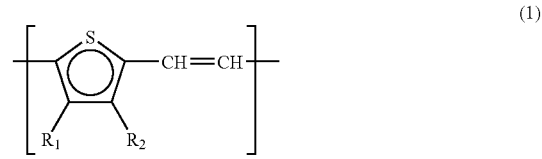

wherein $R^1$ and $R^2$ are each independently a hydrogen atom, an alkoxy or alkyl group.

A process for producing a thermoelectric conversion material is also provided. The process includes dissolving a polythienylenevinylene precursor in an organic solvent to form a precursor solution. The polythienylenevinylene precursor has at least two units represented by formula (3)

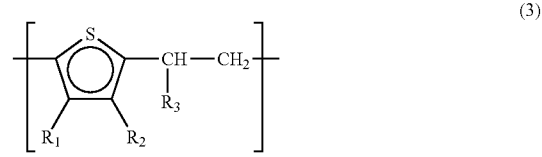

wherein $R^1$ and $R^2$ are each independently a hydrogen atom, or an alkoxy or alkyl group, and $R^3$ is an alkoxy group. The method further includes casting the precursor solution, drying the cast precursor solution to produce a precursor shaped body, thermally decomposing the precursor shaped body to produce a polythienylenevinylene shaped body, and doping the polythienylenevinylene shaped body with a doping material to produce a thermoelectric conversion material.

DETAILED DESCRIPTION

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

Disclosed herein is a thermoelectric conversion device that includes thermoelectric conversion material and a process for producing the material. In one aspect, a thermoelectric conversion device is provided that includes a thermoelectric conversion material. The thermoelectric conversion material includes a polythienylenevinylene that contains multiple thienylenevinylene units that can be represented by formula (1)

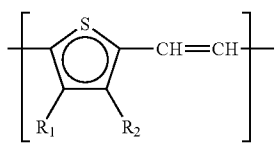

(1)

wherein $R^1$ and $R^2$ are each independently a hydrogen atom, an alkoxy or alkyl group. The polythienylenevinylene is doped with a dopant. In another embodiment, the thermoelectric conversion material can also contain phenylenevinylene units that can be represented by formula (2)

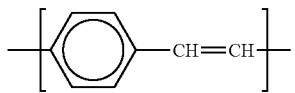

(2)

In another aspect, a process for producing a thermoelectric conversion material is provided. The method includes dissolving a polythienylenevinylene precursor in an organic solvent to form a precursor solution. The polythienylenevinylene precursor has repeating units that can be represented by formula (3)

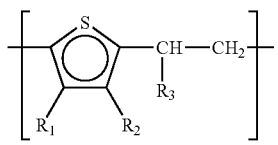

(3)

wherein $R^1$ and $R^2$ are each independently a hydrogen atom, an alkoxy or alkyl group, and $R^3$ is an alkoxy group. The method further includes casting the precursor solution, drying the cast precursor solution to produce a precursor shaped body, thermally decomposing the precursor shaped body to produce a polythienylenevinylene shaped body, and doping the polythienylenevinylene shaped body with a doping material to produce a thermoelectric conversion material.

A thermoelectric conversion device disclosed herein includes a polymeric thermoelectric conversion material that is prepared from a flexible precursor. The flexible precursor is thermally decomposed to provide the thermoelectric conversion material having thermoelectric properties. Methods disclosed herein can provide a thermoelectric conversion material which can be used in a thermoelectric conversion device as disclosed herein.

Thermoelectric conversion materials as disclosed herein include polythienylenevinylene that contains thienylenevinylene units represented by formula (1)

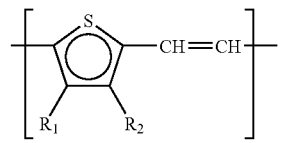

(1)

wherein $R^1$ and $R^2$ are each independently a hydrogen atom, or an alkoxy or alkyl group. In an embodiment, a polymer including the above repeating units can be used as the polythienylenevinylene. In an embodiment, a precursor can be utilized to form the polythienylenevinylene. An exemplary precursor can be represented by formula (3) below.

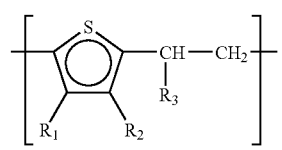

(3)

In an embodiment, the polythienylenevinylene can be a copolymer that also includes phenylenevinylene units that can be represented by formula (2)

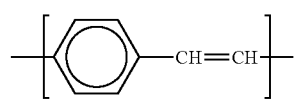

(2)

In an embodiment, a comonomer containing units of formula (1) and (2) can enhance processability of the precursor polymer.

In formulas (1) and (3) above, $R^1$ and $R^2$ are each independently a hydrogen atom, or an alkoxy or alkyl group. In an embodiment, $R^1$ and $R^2$ are each hydrogen atoms. Such an embodiment can provide advantageous electrical conductivity properties. In an embodiment $R^1$ and $R^2$ are each independently an alkoxy or alkyl group. In an embodiment each $R^1$ and $R^2$ are lower alkoxy or lower alkyl groups having 3 or less carbon atoms, for example, a methyl, ethyl, n-propyl or iso-propyl group. In an embodiment $R^3$ is an alkoxy group. In an embodiment where $R^3$ is an alkoxy group, the specific identity thereof can be determined by the alcohol used as a solvent during the production of the precursor polymer, as described later. For example, $R^3$ can be a methoxy group when methanol is used as a solvent, and $R^3$ can be an ethoxy group when ethanol is used as a solvent.

In an embodiment, the polythienylenevinylene used herein can be produced by methods known to those of skill in the art. One such exemplary method can be found in Journal of Chemical Society, Communication, 1448 (1987).

A specific exemplary method of producing a polythienylenevinylene follows. A solution is prepared by dissolving 2,5-dimethylbis(tetrahydrothiophenium chloride) in an appropriate solvent such as a methanol/water mixture. In an embodiment where thienylenevinylene and phenylenevinylene are being copolymerized, p-xylylenebis-(tetrahydrothiophenium chloride) can be added to the solution. The monomer solution is then cooled to a low temperature (e.g., about −30° C.), and stirred. A base, such as sodium hydroxide or tetramethylammonium hydroxide, is then added in an amount approximately equivalent to the monomer amount and the resultant solution is further stirred at a low temperature to affect the polymerization reaction. An acid, such as hydrochloric acid, is added drop wise to the reaction solution to stop the polymerization, and the solution temperature is allowed to recover to room temperature. The precursor polymer will precipitate from solution. In the specific example discussed above, the precursor polymer has the formula as seen in Formula (4) below.

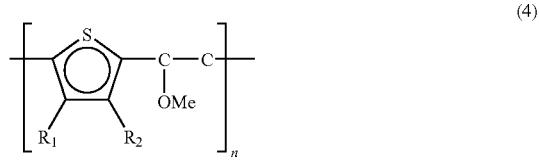

(4)

In formula (4), Me is a methyl group derived from the methanol solvent. Therefore, this group may be changed by using a different solvent such as a different alcohol. The precursor polymer can be recovered and dried to provide a solid precursor polymer.

The solid precursor polymer is then dissolved in an appropriate solvent such as N-methylpyrrolidone. The resultant solution is cast and dried to form a precursor shaped body (e.g., a film). Because the precursor shaped body is flexible, the body can easily be processed (e.g. cut, etc.) according to the desired application.

The precursor shaped body is then thermally decomposed by heating at high temperatures for several hours in an inert atmosphere such as a nitrogen atmosphere to produce a polythienylenevinylene. In an embodiment, the thermal decomposition can be carried out at about 200° C. In an embodiment, the thermal decomposition can be carried out at temperatures less than 120° C. by using an acid catalyst, such as HCl gas for example. In such an embodiment, a lower thermal decomposition temperature can inhibit formation of carbonyl groups that can lower the electrical conductivity. In another embodiment, a protonic acid such as hydrochloric acid, acetic acid or formic acid may be used as the acid catalyst.

The precursor polymer film can optionally be drawn prior to the thermal decomposition. This can, but need not, result in an improvement of the output factor P (as defined below) of the thermoelectric conversion material. Drawing can be conducted at, for example, a draw ratio (film length $L_1$ after drawing/film length $L_0$ before drawing) of about 1.5 to about 10. In an embodiment where the polymer precursor is drawn before thermal decomposition, the weight average molecular weight of the precursor polymer can be about $3 \times 10^4$ or more. In an embodiment where the polymer precursor is drawn before thermal decomposition, the weight average molecular weight of the precursor polymer can be about $6 \times 10^4$ or more. Molecular weights such as these can further improve the output factor P due to drawing because of improvements in molecular orientation.

The resultant polymer can then be doped with a dopant to produce a thermoelectric conversion material. Examples of dopants that can be utilized include, but are not limited to, halogens such as iodine, Lewis acids such as $PF_5$, and halides such as $FeCl_3$. The dopant can be added in an amount of about 0.5 mole or more of the dopant per mole of the repeating units.

Polythienylenevinylene of any molecular weight can be utilized. In an embodiment, the molecular weight of the polythienylenevinylene can be from about 10,000 to about 1,000,000. The molecular weight can generally correspond to a degree of polymerization of a polythienylenevinylene homopolymer of from about 8 to about 800. If the degree of polymerization is too low, the material does not have sufficient strength. If the degree of polymerization is too high, the precursor polymer material can become difficult to process.

In embodiments where the film is optionally drawn before being thermally decomposed, a polymerization degree of about 50 or more can improve molecular orientation which can also improve thermoelectric properties. In other embodiments where the film is drawn, a polymerization degree of about 100 or more can improve molecular orientation which can also improve the thermoelectric properties.

The molecular weight of the polythienylenevinylene can be measured by gel permeation chromatography (GPC) using a polystyrene standard. Further details of specific exemplary measurement methods are described in the examples.

The thermoelectric conversion properties of a thermoelectric conversion material can be evaluated by an output factor P. The output factor P can be determined by the electrical conductivity σ (S/cm) of the material and the electromotive force per temperature of the material, namely, the Seebeck coefficient S (V/K), and can be determined as follows:

$P = S^2 \times \sigma (Wm^{-1}K^{-2})$

Polythienylenevinylene thermoelectric conversion materials disclosed herein can have output factors P of at least about $10 \times 10^{-8}$ $Wm^{-1}K^{-2}$. In some embodiments, thermoelectric conversion materials disclosed herein can have output factors P of at least about $100 \times 10^{-8}$ $Wm^{-1}K^{-2}$.

Thermoelectric conversion devices as disclosed herein generally include a base unit that includes thermoelectric conversional material as disclosed herein that is electrically and physically connected to thermoelectric conversion semiconductors or metals. Exemplary thermoelectric conversion semiconductors include materials such as bismuth selenide or aluminum-doped zinc oxide. Exemplary metals include materials such as platinum or palladium. The thermoelectric conversion materials can be connected (electrically, physically, or both) to the thermoelectric conversion semiconductors or metals by known methods. An exemplary connection method includes the use of conductive paste bonding, or coating such as vapor deposition or sputtering.

In some embodiments, a plurality of base units can be connected in series to form a thermoelectric conversion device. In embodiments where temperature differences are formed between connection points, the device can become a thermoelectric power generator that can produce thermoelectric power. In embodiments where electric current is applied through the device, the device can become a Peltier cooler which can transfer heat between connection points.

EXAMPLES

The current disclosure is explained below by making reference to examples; however, the disclosure is in no way restricted thereby.

Example 1

Polythienylenevinylene (PTV) was synthesized by the following procedure. 5.28 g of 2,5-thienylene dimethylbis(tetrahydrothiophenium chloride) was dissolved in a mixture of 49.2 ml of methanol and 9.6 ml of water. The solution was then purged with nitrogen gas. An aqueous solution (15 ml) containing NaOH in an amount equivalent to the monomer was added drop wise to the purged solution while the solution was being cooled to −30° C. and stirred. The monomer concentration was 0.2 M, and the volume ratio of methanol to water was 2:1. The solution was further stirred at −30° C. under a nitrogen gas flow for 2 hours. The reaction was then terminated by neutralizing the solution with hydrochloric acid. The solution temperature gradually recovered to room temperature with stirring. A yellow precipitate was recovered and washed with water while being suction filtered. The solid was dried to give a precursor polymer with a yield of 26.1%.

The molecular weight of the PTV precursor polymer obtained above was determined by gel permeation chromatography (GPC). The GPC determination was carried out by dissolving the precursor powder in N-methylpyrrolidone (NMP) to produce a solution containing 0.1 wt. % of the PTV precursor polymer. The refractive index change at room temperature was observed while an NMP solution containing 10 mM of $NaBF_4$ was used as an eluant. As a result, the weight average molecular weight of the precursor polymer was found to be $3.0 \times 10^5$ on the basis of polystyrene, and the polydispersion degree was found to be 8.7. The polymerization degree was therefore 250.

The PTV precursor polymer dissolved in NMP was cast in a vessel, and dried under a reduced pressure to give a PTV precursor polymer film. The PTV precursor polymer film was then thermally decomposed at 200° C. under a nitrogen gas flow for 5 hours. The PTV film was subjected to infrared absorption measurements, the disappearance of a peak at 1,087 $cm^{-1}$ originating from the methoxy group of the precursor polymer was confirmed after the thermal decomposition, and a trans-vinylene C—H stretching vibration peak at 919 $cm^{-1}$ was observed. Formation of the PTV was thus confirmed.

The PTV film was doped with iodine to manifest electrical conductivity. The PTV film was exposed to iodine vapor for doping. Specifically the PTV film was placed in a vessel with solid iodine under reduced pressure at room temperature for over 12 hours. Saturated iodine vapor doped the PTV film fully after the doping treatment. Doping time for full doping was confirmed by measuring the electrical conductivity of the doped PTV film at various times. Typically, doping times of 12 hours were long enough to fully dope the PTV film. The doping level was about 2 atom of iodine per repeated unit of PTV. The same doping procedure was used for all of the following examples. Two thermocouples (Pt/PtRh) were bonded (with carbon paste) to the surface of the film (in the center of the film), and two electrodes (Pt) were bonded to both ends of the film to provide a measuring element. A temperature difference (about 5K) was produced in the longitudinal direction of the sample with a heater. The electromotive force and the temperature difference were then measured. The electromotive force per temperature difference, namely, the Seebeck coefficient, was determined from the measured value. The electrical conductivity was measured at the same time using four-probes. From the Seebeck coefficient S and electrical conductivity σ, the output factor P was calculated, using the following formula: $P=S^2\sigma$. The results are shown in Table 1.

Example 2

The PTV precursor polymer film obtained in Example 1 was drawn to an elongation ratio of 2. The drawn film was thermally decomposed at 200° C. under a nitrogen gas flow for 5 hours to give a PTV film. The PTV film was doped with iodine using the procedure described in Example 1. The thermoelectric properties of the resultant PTV film were measured, in the same manner as in Example 1. The results are shown in Table 1. Improvement of the thermoelectric properties by drawing can be seen by comparing the results from Example 1 and Example 2 in Table 1.

Example 3

PTV was synthesized as in Example 1 with the following exceptions. 5.37 g of 2,5-thienylene dimethylbis(tetra-hydrothiophenium chloride) was dissolved in a mixture of 113 ml of methanol and 23 ml of water. The aqueous solution (15 ml) containing 1.1 equivalents of NaOH (to the monomer) was added drop wise to the solution while the solution was being cooled to −30° C. and stirred. The monomer concentration was 0.1 M, and the volume ratio of methanol to water was 3:1. The solution was further stirred at −30° C. under a nitrogen gas flow for 4 hours. Further processing of the solution occurred as in Example 1. The solid thus obtained was dried to give a precursor polymer with a yield of 17.6%.

The molecular weight of the PTV precursor polymer was determined by GPC. The GPC determination was carried out as in Example 1, with the exception that tetrahydrofuran (THF) was utilized in place of NMP. As a result, the weight average molecular weight of the precursor polymer was found to be $7.6 \times 10^4$ on the basis of polystyrene, and the polydispersion degree was found to be 4.4. The polymerization degree was therefore 120.

A PTV precursor polymer film was cast in the same manner as in Example 1. This precursor polymer film was thermally decomposed at 200° C. under a nitrogen gas flow for 10 hours to give a PTV film. The PTV film was doped with iodine using the same procedure described in Example 1. The thermoelectric properties of the resultant PTV film were measured, in the same manner as in Example 1. The results are shown in Table 1.

Example 4

The PTV precursor polymer film obtained in Example 3 was drawn to an elongation ratio of 2, and thermally decomposed at 200° C. under a nitrogen gas flow for 10 hours to give a PTV film. The PTV film was doped with iodine using the same procedure described for Example 1. The thermoelectric properties of the resultant PTV film were measured, in the same manner as in Example 1. The results are shown in Table 1.

Example 5

The PTV precursor polymer film obtained in Example 3 was drawn to an elongation ratio of 3, and thermally decomposed at 200° C. under a nitrogen gas flow for 10 hours to give a PTV film. The PTV film was doped with iodine using the same procedure described for Example 1. The thermoelectric properties of the resultant PTV film were measured, in the same manner as in Example 1. The results are shown in Table 1. Improvement of the thermoelectric properties by drawing can be seen by comparing the results in Example 3, 4 and 5.

Example 6

The PTV precursor polymer film obtained in Example 3 was thermally decomposed at 100° C. under a nitrogen gas flow containing a small amount of HCl gas for 4 hours to give a PTV film. The PTV film was doped with iodine using the same procedure described for Example 1. The thermoelectric properties of the resultant PTV film were measured as in Example 1. The results are shown in Table 1. Improvement of the thermoelectric properties by thermal decomposition under different conditions can be seen by comparing the results in Examples 3 and 6.

Example 7

The PTV precursor polymer film obtained in Example 3 was drawn to an elongation ratio of 2, and thermally decomposed in the same manner as in Example 6 to give a PTV film.

The PTV film was doped with iodine using the same procedure described for Example 1. The thermoelectric properties of the resultant PTV film were measured in the same manner as in Example 1. The results are shown in Table 1. Improvement of the thermoelectric properties by drawing can be seen by comparing the results in Examples 6 and 7.

Example 8

PTV was synthesized as in Example 1 with the following exceptions. 5.88 g of 2,5-thienylene dimethylbis(tetrahydrothiophenium chloride) was dissolved in a mixture of 123 ml of methanol and 5 ml of water. An aqueous solution (36 ml) containing 1.1 equivalents of NaOH (to monomer) was added drop wise to the solution while the solution was being cooled to −30° C. and stirred. The monomer concentration was 0.1 M, and the volume ratio of methanol to water was 3:1. The solution was further stirred at −30° C. under a nitrogen gas flow for 6 hours. Further processing of the solution occurred as in Example 1. The solid was dried to give a precursor polymer with a yield of 19.1%. The molecular weight of the PTV precursor polymer was determined by GPC as in Example 3. The weight average molecular weight of the precursor polymer was found to be $1.3 \times 10^4$ on the basis of polystyrene, and the polydispersity degree was found to be 2.7. The polymerization degree was therefore 30. A PTV precursor polymer film was obtained in the same manner as in Example 1. The polymer film was further thermally decomposed in the same manner as in Example 5 to give a PTV film. The PTV film was doped with iodine using the same procedure described for Example 1. The thermoelectric properties of the resultant PTV film were measured in the same manner as in Example 1. The results are shown in Table 1.

Example 9

The PTV precursor polymer film obtained in Example 8 was drawn to an elongation ratio of 6, and thermally decomposed in the same manner as in Example 6 to give a PTV film. The PTV film was doped with iodine using the same procedure described for Example 1. The thermoelectric properties of the resultant PTV film were measured in the same manner as in Example 1. The results are shown in Table 1.

Comparison of Examples 8 and 9; and the results from the other examples (for drawing a high molecular weight PTV) shows that the improvement of the thermoelectric properties of a low molecular weight PTV is less significant even when the PTV is drawn.

TABLE 1

| Ex. No. | Mw of precursor polymer ($M_w/M_n$) | Degree of Polymerization | Draw ratio | Thermal Decomposition | σ (S/cm) | S ($10^{-6}$ V/K) | P ($10^{-8}$ Wm$^{-1}$K$^{-2}$) |
|---|---|---|---|---|---|---|---|
| 1 | $3.0 \times 10^5$ (8.7) | 250 | — | $N_2$ | 10.0 | 14.2 | 28.6 |
| 2 | $3.0 \times 10^5$ (8.7) | 250 | 2 | $N_2$ | 28.1 | 21.0 | 124.2 |
| 3 | $7.6 \times 10^4$ (4.4) | 120 | — | $N_2$ | 21.1 | 11.6 | 28.4 |
| 4 | $7.6 \times 10^4$ (4.4) | 120 | 2 | $N_2$ | 45.9 | 17.8 | 144.9 |
| 5 | $7.6 \times 10^4$ (4.4) | 120 | 3 | $N_2$ | 62.1 | 17.5 | 190.2 |
| 6 | $7.6 \times 10^4$ (4.4) | 120 | — | $N_2$ + HCl | 105.6 | 14.1 | 209.9 |
| 7 | $7.6 \times 10^4$ (4.4) | 120 | 2 | $N_2$ + HCl | 230.7 | 12.8 | 378.0 |
| 8 | $1.3 \times 10^4$ (2.7) | 30 | — | $N_2$ + HCl | 47.4 | 13.4 | 85.1 |
| 9 | $1.3 \times 10^4$ (2.7) | 30 | 6 | $N_2$ + HCl | 49.3 | 13.9 | 63.8 |

Thus, embodiments of thermoelectric conversion materials are disclosed. One skilled in the art will appreciate that the present disclosure can be practiced with embodiments other than those disclosed. The disclosed embodiments are presented for purposes of illustration and not limitation, and the present disclosure is limited only by the claims that follow.

The invention claimed is:

1. A thermoelectric conversion device comprising a thermoelectric conversion material, wherein the thermoelectric conversion material comprises a polythienylenevinylene comprising thienylenevinylene units represented by formula (1)

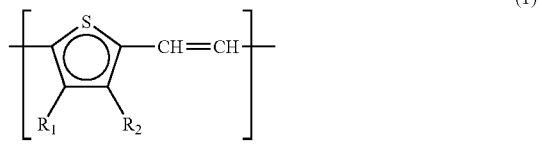

wherein $R^1$ and $R^2$ are each independently a hydrogen atom, or an alkoxy or alkyl group, and wherein the thermoelectric conversional material is doped with a dopant and wherein the thermoelectric conversion material has an output factor P of at least about $100 \times 10^{-8}$ Wm$^{-1}$K$^{-2}$.

2. The thermoelectric conversion device according to claim 1, wherein the polythienylenevinylene of the thermoelectric conversion material has a polymerization degree of from about 8 to about 800.

3. The thermoelectric conversion device according to claim 1, wherein the polythienylenevinylene of the thermoelectric conversion material has a polymerization degree of at least about 50, and is a drawn film.

4. The thermoelectric conversion device according to claim 1, wherein the polythienylenevinylene further comprises at least one phenylenevinylene unit represented by formula (2)

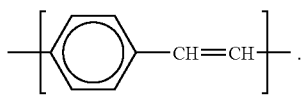

(2)

5. A process for producing a thermoelectric conversion material, comprising the steps of:
dissolving a polythienylenevinylene precursor in an organic solvent to produce a precursor solution, the polythienylene vinylene precursor comprising at least two units represented by formula (3)

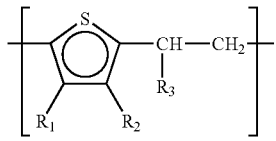

(3)

wherein $R^1$ and $R^2$ are each independently a hydrogen atom, or an alkoxy or alkyl group, and $R^3$ is an alkoxy group;
casting the precursor solution;
drying the cast precursor solution to produce a precursor shaped body;
thermally decomposing the precursor shaped body to produce a polythienylenevinylene shaped body at temperatures less than about 120° C. in the presence of an acid catalyst; and
doping the polythienylenevinylene shaped body with a doping material to produce a thermoelectric conversion material.

6. The process for producing a thermoelectric conversion material according to claim 5, wherein the precursor shaped body is a film, and the process further comprises drawing the film.

7. The process for producing a thermoelectric conversion material according to claim 6, wherein the precursor shaped body is a film, and has a weight average molecular weight of at least about $3 \times 10^4$.

8. A process for producing a thermoelectric conversion material, comprising the steps of:
dissolving a polythienylenevinylene precursor in an organic solvent to produce a precursor solution, the polythienylene vinylene precursor comprising at least two units represented by formula (3)

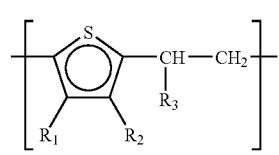

(3)

wherein $R^1$ and $R^2$ are each independently a hydrogen atom, or an alkoxy or alkyl group, and $R^3$ is an alkoxy group;
casting the precursor solution;
drying the cast precursor solution to produce a precursor film shaped body;
thermally decomposing and drawing the precursor film shaped body to produce a polythienylenevinylene film shaped body; and
doping the polythienylenevinylene film shaped body with a doping material to produce a thermoelectric conversion material.

9. The process for producing a thermoelectric conversion material according to claim 8, wherein the precursor film shaped body has a weight average molecular weight of at least about $3 \times 10^4$.

\* \* \* \* \*